US012764897B2

(12) United States Patent
Liu

(10) Patent No.: US 12,764,897 B2
(45) Date of Patent: Oct. 13, 2026

(54) DISPLAY DEVICE-EQUIPPED CHASSIS STRUCTURE

(71) Applicant: HYTE CORP., City of Industry, CA (US)

(72) Inventor: You-Chi Liu, City of Industry, CA (US)

(73) Assignee: HYTE CORP., City Of Industry, CA (US)

( * ) Notice: Subject to any disclaimer, the term of this patent is extended or adjusted under 35 U.S.C. 154(b) by 253 days.

(21) Appl. No.: 18/650,926

(22) Filed: Apr. 30, 2024

(65) Prior Publication Data

US 2025/0338430 A1 Oct. 30, 2025

(51) Int. Cl.

| | |
|---|---|
| ***H05K 7/20*** | (2006.01) |
| ***G06F 1/16*** | (2006.01) |
| ***G06F 1/18*** | (2006.01) |
| ***G06F 1/20*** | (2006.01) |

(52) U.S. Cl.

CPC ....... *H05K 7/20145* (2013.01); *G06F 1/1613* (2013.01); *G06F 1/181* (2013.01); *G06F 1/20* (2013.01)

(58) Field of Classification Search

CPC ............ H05K 7/20145; H05K 7/20954; G06F 1/1601; G06F 1/16; G06F 1/181; G06F 1/20; G06F 1/328; G06F 3/041; G06F 1/1613

See application file for complete search history.

(56) References Cited

U.S. PATENT DOCUMENTS

| | | | | |
|---|---|---|---|---|
| 10,514,733 | B1 * | 12/2019 | Hsu | G06F 1/184 |
| 11,259,440 | B1 * | 2/2022 | Chen | G06F 1/181 |
| 2020/0371567 | A1 * | 11/2020 | Chuang | G06F 1/188 |

* cited by examiner

*Primary Examiner* — Robert J Hoffberg
*Assistant Examiner* — Jamil Alexander Decker
(74) *Attorney, Agent, or Firm* — MUNCY, GEISSLER, OLDS & LOWE, P.C.

(57) ABSTRACT

A display device-equipped chassis structure includes a base assembled with a first fan set, a casing positioned on the base and peripherally provided with two side panels, a heat dissipation side panel and a back panel, a top cover assembled on the casing and provided with a second fan set at the bottom thereof, a display device assembled on mounting portions of the base, and an air guide plate with the main body set on the base between the display device and the heat dissipation side panel to define a flow space between the main body and the display device and a heat dissipation space between the main body and the heat dissipation side panel. The air guide plate distinguishes the flow space and the heat dissipation space and cooperates with each fan set for efficient heat dissipation to achieve the cooling effect inside the chassis.

12 Claims, 22 Drawing Sheets

DISPLAY DEVICE-EQUIPPED CHASSIS STRUCTURE

BACKGROUND OF THE INVENTION

1. Field of the Invention

The present invention relates to a display device-equipped chassis structure, and in particular to a display device-equipped chassis structure that distinguishes a flow space and a heat dissipation space through an air guide plate inside the display device-equipped chassis, so that each fan inside the chassis can extract the heat source in the flow space to the heat dissipation space for discharge and cooling, so as to solve the problem of insufficient internal heat dissipation due to the installation of the display device in the chassis.

2. Description of the Related Art

With the rapid development of electronic technology and network technology, both personal computers and computer servers have become an indispensable part of people's daily lives. At the same time, with the rise of the e-sports industry, computers used in e-sports have also begun mass production, and computer host-style settings have become one of the focuses of modern computer purchase.

Furthermore, the installation of a display device connected to the computer host through the computer host casing has become one of the main reasons for attracting people to purchase the computer host. However, existing hosts do not really add additional design to the design of the display device. After operation, the display device will also generate heat energy through operation, which will generate more heat inside the host and increase the risk of internal components crashing of the host.

Moreover, many hosts are not designed for the arrangement and assembly of hardware, which results in heavier hardware such as graphics cards having to be plugged horizontally onto the motherboard due to space constraints. In the long run, the hardware will be affected by gravity and tilt downward, resulting in poor contact or even separation from the motherboard. The instability of hardware such as graphics cards can cause damage to the computer host. In addition, horizontal plugging will also block the heat dissipation channel of the fan, which is not conducive to internal air ducts for heat dissipation. This is the key point that those engaged in this industry urgently want to study and improve.

SUMMARY OF THE INVENTION

Therefore, in view of the above-mentioned problems and deficiencies, the inventor collected relevant information, and after various evaluations and considerations, he designed this invention of display device-equipped chassis structure.

The main object of the present invention is that the display device-equipped chassis structure comprises a base, a casing, a top cover, a display device and an air guide plate. The base has a first fan set assembled thereon and is provided with a positioning structure at the outer periphery near the first fan set. The positioning structure comprises at least two first positioning grooves for the assembly of the casing, and a second positioning groove located between the first positioning grooves for the display device to be assembled. The casing comprises at least two side panels respectively positioned on the first positioning grooves, a heat dissipation side panel with a plurality of heat dissipation holes assembled on one side of the side panels away from the second positioning groove, and a back panel set between the heat dissipation side panel and one side of the side panel. The top cover is assembled on the top side of the casing, and a second fan set is assembled on one side of the bottom surface thereof adjacent to the second positioning groove. The display device comprises a plurality of mounting portions assembled at the second positioning grooves of the base, a display surface with a display screen provided on the surface of the display device, and a heat source portion provided on one side thereof inside the casing. The air guide plate comprises a main body set on the base between the display device and the heat dissipation side panel, a flow space formed between the main body and the display device, a heat dissipation space formed between the main body and the heat dissipation side panel, an exhaust portion located on one side of the main body and a third fan set mounted in the exhaust portion. Through the assembly of the air guide plate, the flow space and the heat dissipation space are distinguished, and the first fan set, the second fan set and the third fan set are used for efficient heat dissipation to achieve the cooling effect inside the chassis.

Another object of the present invention is that the base comprises a bottom panel and a first assembly frame. The first fan set is provided on the bottom panel. The first assembly frame has a storage chamber located at the bottom side to cover the first fan set, a storage surface located on the top and provided with a plurality of air guide holes, and a positioning structure provided on the outer periphery adjacent to the first fan set for the assembly of the side panels of the casing and the display device. The positioning structure comprises at least two first positioning grooves for the assembly of the side panels and a second positioning groove located between the first positioning grooves for the display device to be assembled. The bottom panel of the base is provided with a plurality of bottom panel heat dissipation vents at the bottom part corresponding to the first fan set, and a wire organizer with a plurality of flat cable straps is provided on one side of the bottom panel adjacent to the first fan set.

Still another object of the present invention is that the bottom panel of the base is provided with pairs of cable holes for the flat cable straps to be inserted and fixed.

Still another object of the present invention is that the surface of the first assembly frame of the base is provided with a handle extending upward for people to hold.

Still another object of the present invention is that the heat dissipation side panel of the casing is provided with a plurality of heat dissipation holes.

Still another object of the present invention is that the top cover comprises a second assembly frame and a top cover heat sink assembled on said second assembly frame and a second fan set assembled on the one side of the bottom surface of the second assembly frame adjacent to the display device. The second assembly frame comprises a plurality of ventilation openings corresponding to the second fan set, a fixing portion located on one side corresponding to the display device, and a plurality of fixing grooves provided in the fixing portion. The top cover heat sink comprises a plurality of top cover heat dissipation vents.

Still another object of the present invention is that each mounting portion of the display device has at least one mounting hole for a preset screw to pass through and fix.

Still another object of the present invention is that the exhaust portion of the air guide plate on one side of the main body is provided with a plurality of exhaust openings corresponding to the third fan set, and the main body is provided with a plurality of flat cable holes and a window, and each of these flat cable holes is provided with a downwardly inclined wind shield.

Still another object of the present invention is that the surface of wind shield has an inclined surface that extends gradually toward one side, and the adjacent two sides of the inclined surface are provided with side walls that are connected to the flat cable holes to form a barrier, and a connection port is formed between the inclined surface and each side wall.

Still another object of the present invention is that the back panel is assembled with a plurality of host hardware extending into the casing, and the host hardware further has a horizontally extending fixed plate, and a display card socket for a display card to be inserted and fixed from top to bottom is protruding from the top of the fixed plate, and a plurality of connecting flat cables are extended from the fixed plate towards a preset motherboard, and a connector is connected to the ends of the connecting flat cables, and the connecting portion on one side of the connector is connected to the preset motherboard.

Still another object of the present invention is that the top cover is provided with at least one positioning groove respectively facing the two side panels and the heat dissipation side panel, and each positioning groove is provided with two relatively inwardly inclined positioning plates; the heat dissipation side panel corresponding to the positioning grooves has elastic second positioning bumps that extend into the positioning grooves respectively and are slightly larger than the positioning grooves; a plurality of flange portions are provided on one side of the base facing the heat dissipation side panel, and positioning walls are extending inward on both sides of the flange portions, and each of the flange portions is provided with a slot inward; the bottom of the heat dissipation side panel is equipped with fitting blocks that are fitted into the respective slots, and fitting grooves are recessed on both sides of each fitting block and embedded in the respective positioning walls.

Still another object of the present invention is that the top cover further comprises a plurality of first side panel fixing grooves in the direction toward each side panel and an elastic and inward arc-shaped fixing sleeve located in each first side panel fixing groove; each side panel comprises a plurality of elastic first positioning bumps corresponding to the first side panel fixing grooves and respectively inserted into the respective fixing sleeve to form a fixation.

Still another object of the present invention is that the top cover further comprises a plurality of second side panel fixing grooves in the direction toward each side panel and an elastic and inclined support rod located in each second side panel fixing groove; each side panel comprises a plurality of protrusions corresponding to the second side panel fixing groove and respectively inserted into the respective second side panel fixing grooves to stop against the respective inclined support rods.

Still another object of the present invention is that the main body has a curved bending portion located on one side thereof.

DETAILED DESCRIPTION OF THE PREFERRED EMBODIMENT

Figure 1:
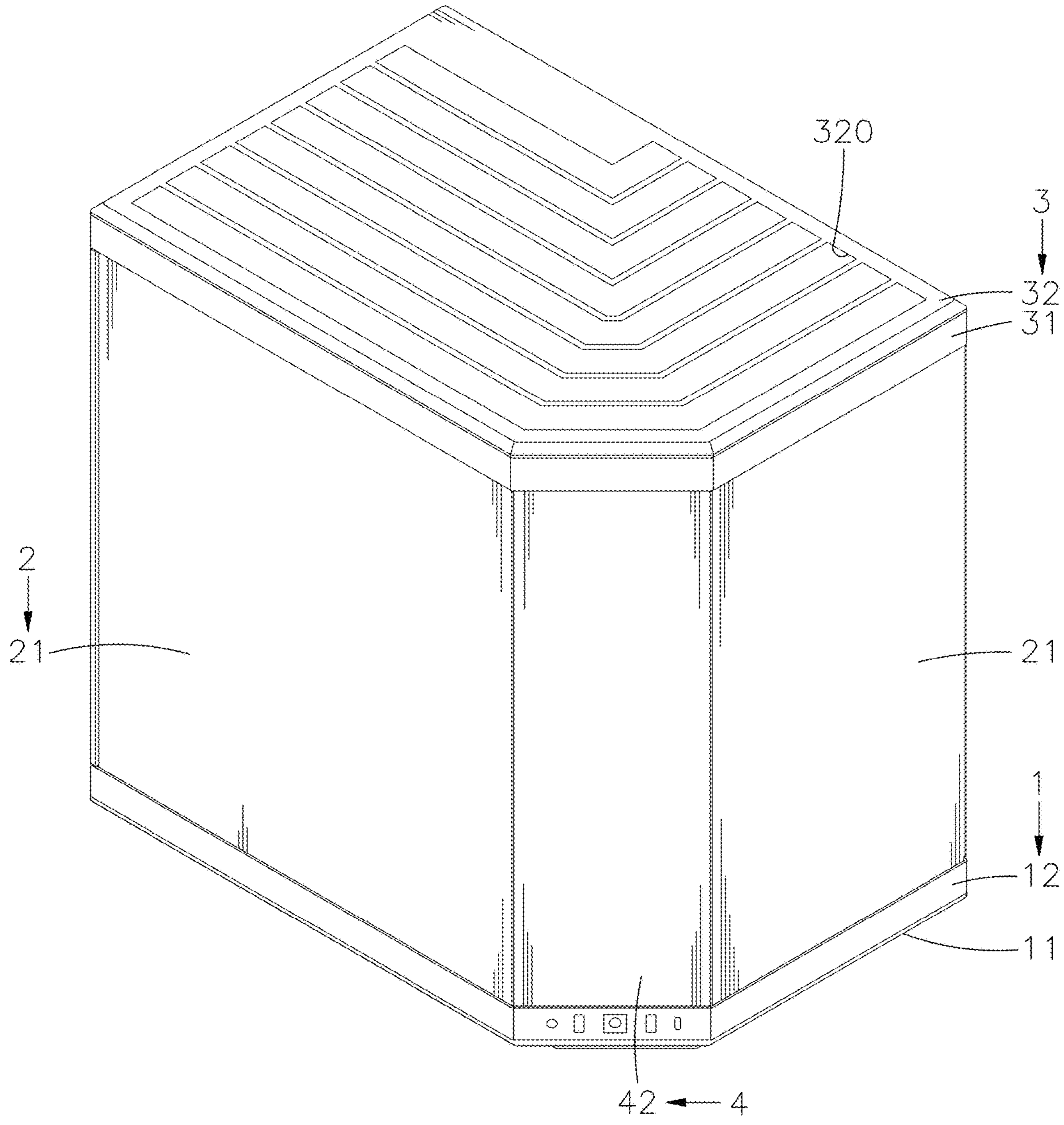
FIG. 1 is a three-dimensional appearance view of the display device-equipped chassis structure of the present invention.
Figure 2:
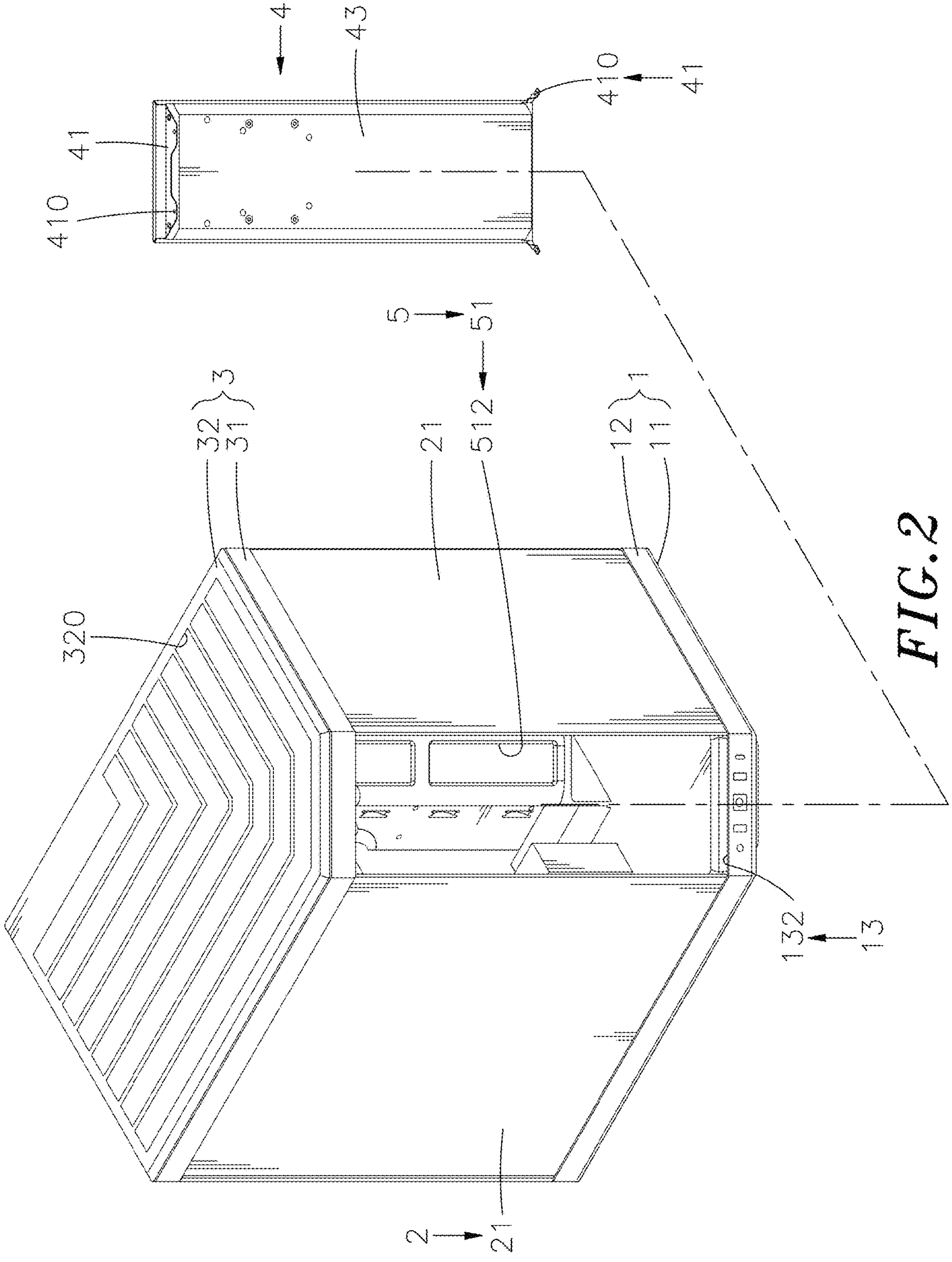
FIG. 2 is a schematic diagram of the assembly of the display device of the display device-equipped chassis structure of the present invention.
Figure 3:
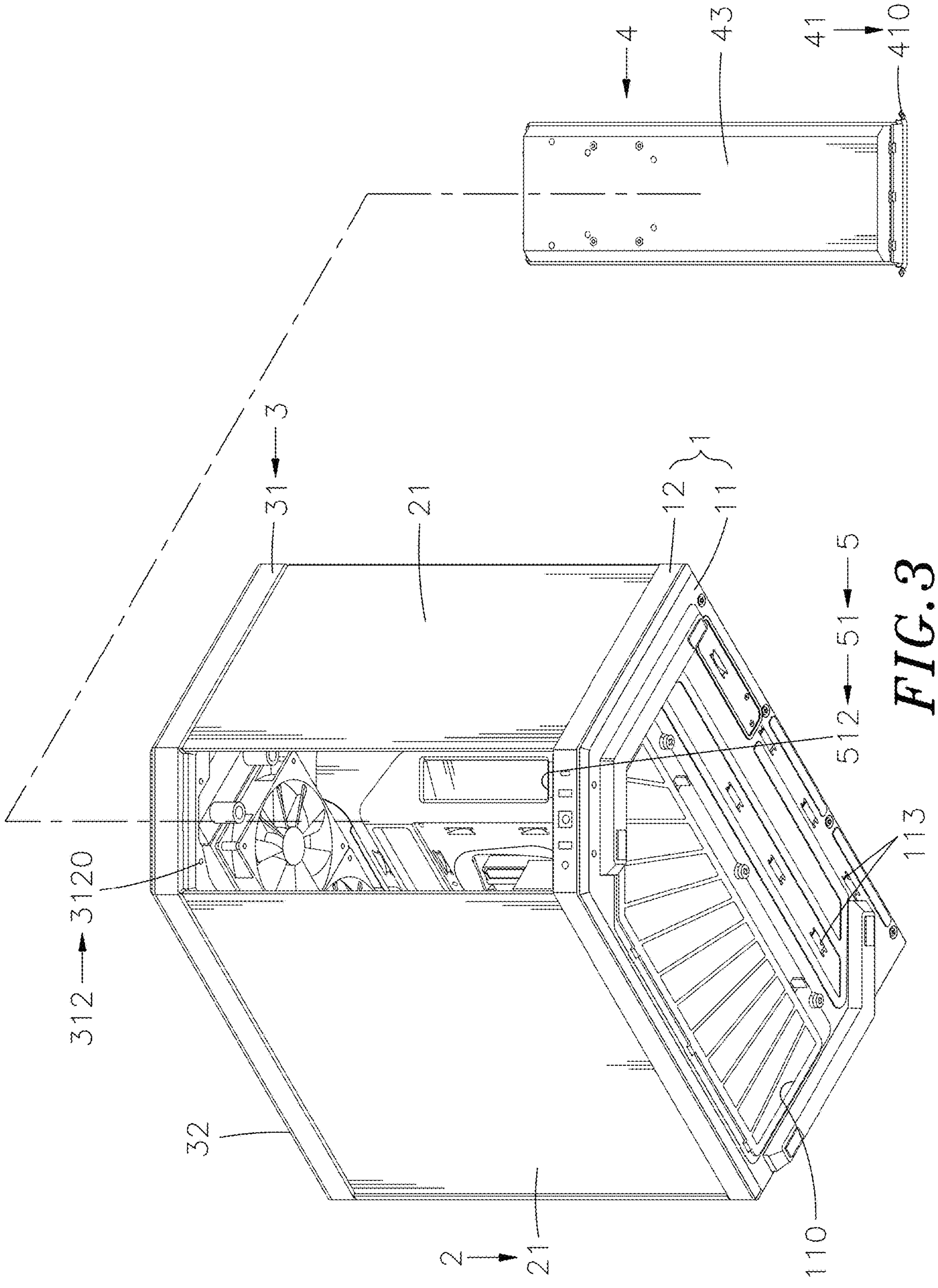
FIG. 3 is a schematic diagram of the assembly of the display device of the display device-equipped chassis structure of the present invention when viewed from another angle.
Figure 4:
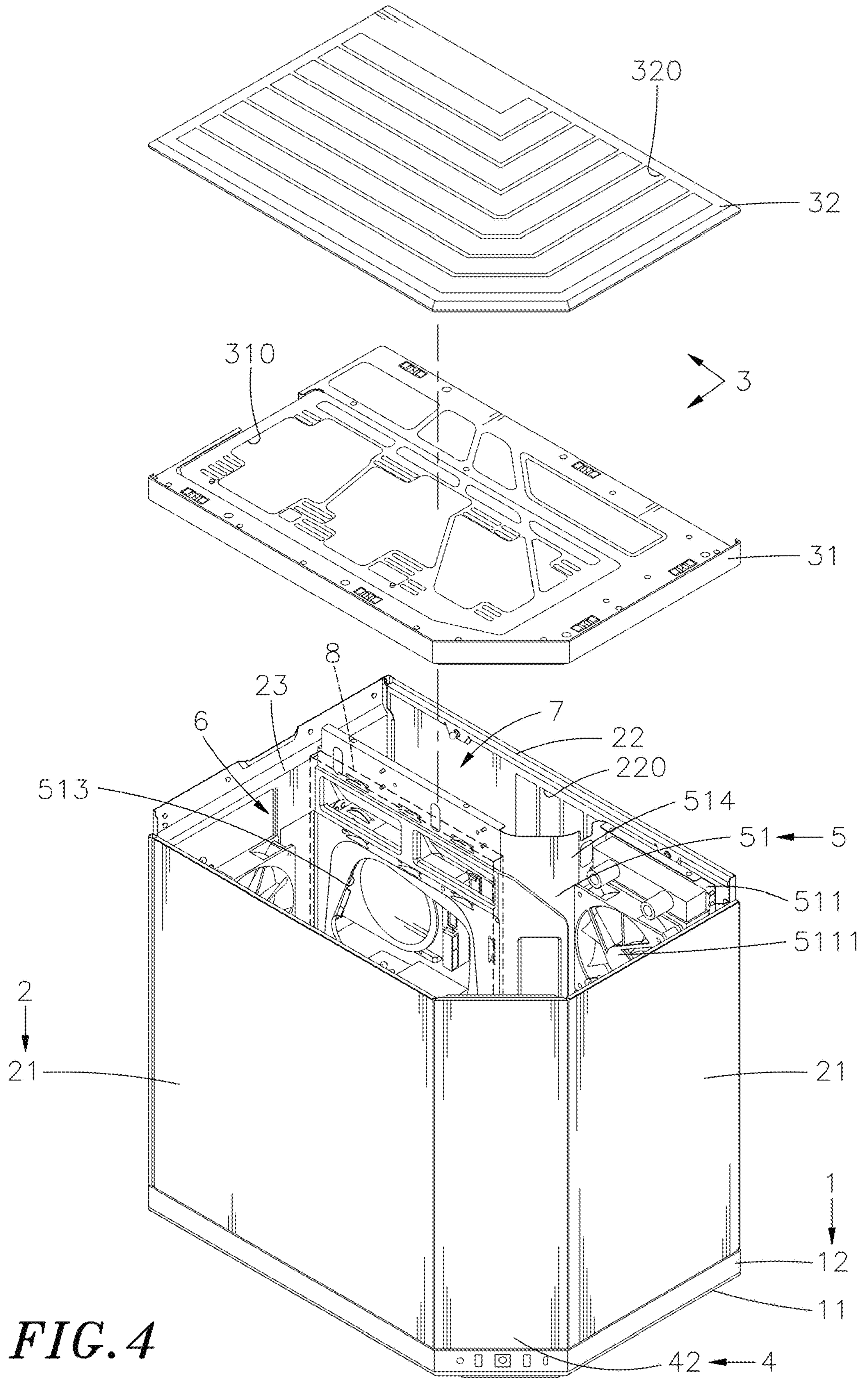
FIG. 4 is a schematic diagram of the assembly of the top cover of the display device-equipped chassis structure of the present invention.
Figure 5:
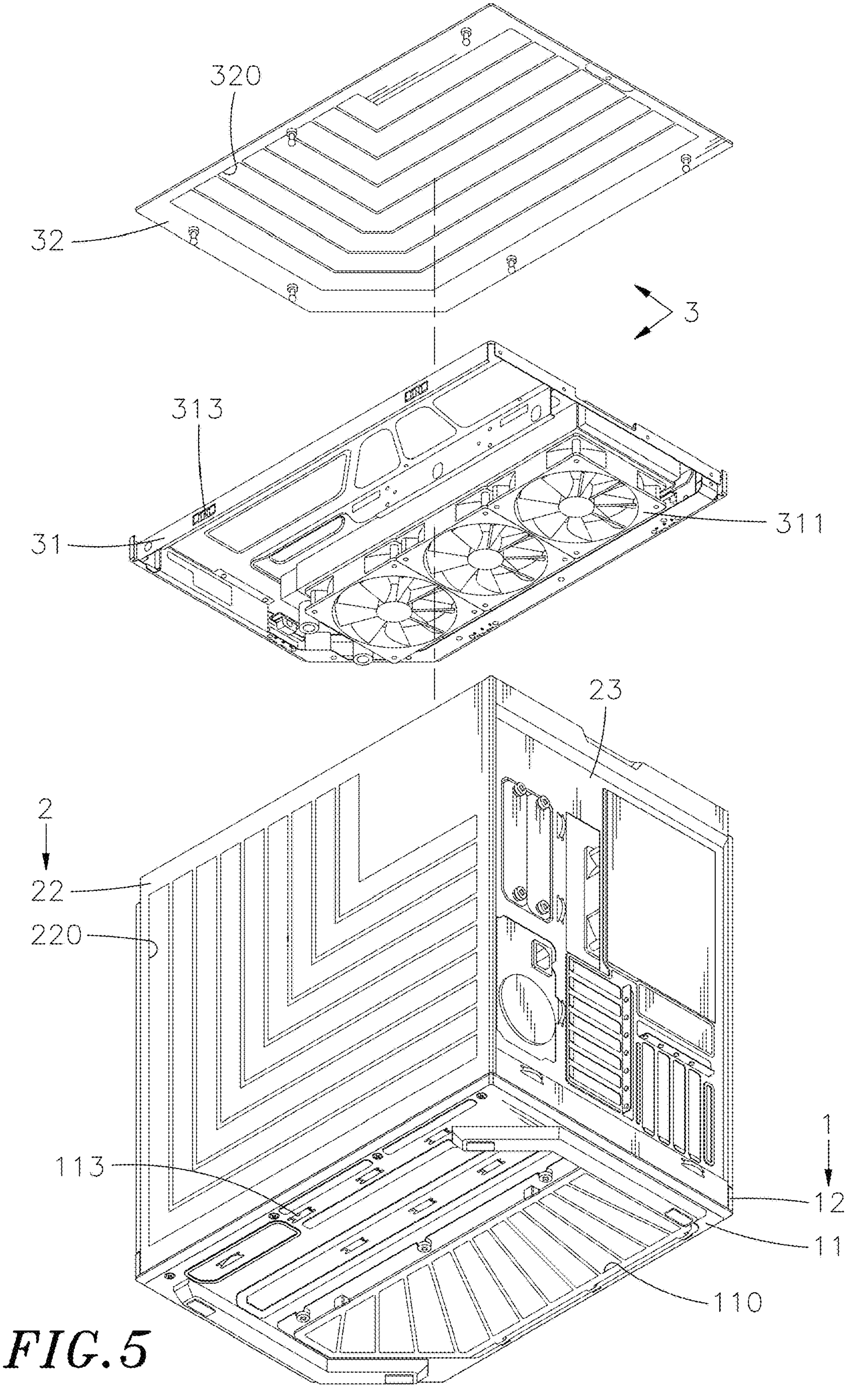
FIG. 5 is a schematic diagram of the assembly of the top cover of the display device-equipped chassis structure of the present invention when viewed from another angle.

Please refer to FIGS. 1-7, which are three-dimensional appearance view of the display device-equipped chassis structure of the present invention, schematic diagram of the assembly of the display device of the display device-equipped chassis structure of the present invention, schematic diagram of the assembly of the display device of the display device-equipped chassis structure of the present invention when viewed from another angle, schematic diagram of the assembly of the top cover of the display device-equipped chassis structure of the present invention, schematic diagram of the assembly of the top cover of the display device-equipped chassis structure of the present invention when viewed from another angle, schematic diagram of the assembly of the base of the display device-equipped chassis structure of the present invention and schematic diagram of the assembly of the base of the display device-equipped chassis structure of the present invention when viewed from another angle. The display device-equipped chassis structure of the present invention mainly comprises a base 1, a casing 2, a top cover 3, a display device 4 and an air guide plate 5, and the connection relationship of the aforementioned components is as follows:

The base 1 comprises a bottom panel 11 and a first assembly frame 12, and the bottom panel 11 is provided with a first fan set 111. A plurality of bottom panel heat dissipation vents 110 are provided at the bottom of the bottom panel 11 corresponding to the first fan set 111. A wire organizer 112 with a plurality of flat cable straps 1121 is provided on one side adjacent to the first fan set 111. The bottom of the first assembly frame 12 is provided with a storage chamber 120 covering the first fan set 111. A storage surface 121 on the top of the first assembly frame 12 is provided with a plurality of air guide holes 1210. A positioning structure 13 for assembling the casing 2 and the display device 4 is provided on the outer periphery of the first assembly frame 12 adjacent to the first fan set 111. The positioning structure 13 comprises at least two first positioning grooves 131 for the assembly of the casing 2 and a second positioning groove 132 located between the two first positioning grooves 131 for the display device 4 to be assembled.

The casing 2 comprises at least two side panels 21 respectively positioned on the two first positioning grooves 131, a heat dissipation side panel 22 with a plurality of heat dissipation holes 220 assembled on the side of the two side panels 21 away from the display device 4, and a back panel 23 provided between one side of the heat dissipation side panel 22 and one of the opposite side panels 21 for installing a plurality of host hardware 231.

The top cover 3 is assembled on the top side of the casing 2. The top cover 3 comprises a second assembly frame 31 and a top cover heat sink 32. A second fan set 311 is assembled on one side of the bottom surface of the second assembly frame 31 adjacent to the display device 4. A plurality of ventilation openings 310 are provided on the second assembly frame 31 corresponding to the second fan set 311. The second assembly frame 31 is provided with a fixing portion 312 on one side thereof corresponding to the display device 4, and a plurality of fixing grooves 3120 are provided in the fixing portion 312. The top cover heat sink 32 is assembled on the second assembly frame 31, and a plurality of top cover heat dissipation vents 320 are provided on the surface of the top cover heat sink 32.

The display device 4 comprises a plurality of mounting portions 41 assembled at the second positioning grooves 132 of the base 1 and the fixing portion 312 of the top cover 3, and each mounting portion 41 has at least one mounting hole 410 for penetration and fixation of a respective preset screw (not shown). The surface of the display device 4 is provided with a display surface 42 with a display screen, and a heat source portion 43 is provided on one side of the display device 4 inside the casing 2.

The air guide plate 5 comprises a main body 51 located on the base 1 between the display device 4 and the heat dissipation side panel 22 of the casing 2, and a flow space 6 is formed between the main body 51 and the display device 4, and a heat dissipation space 7 is formed between the main body 51 and the heat dissipation side panel 22. The air guide plate 5 further comprises an exhaust portion 511 located on one side of the main body 51 and provided with a third fan set 5111, a plurality of exhaust openings 5110 located on the exhaust portion 511 corresponding to the third fan set 5111, a plurality of flat cable holes 512 and a window 513 located on the main body 51, a downwardly inclined wind shield 52 provided on each of the flat cable holes 512, and a curved bending portion 514 provided on one side of the main body 51. The size, angle, and direction of the bending portion 514 are used to adjust the size of the flow space 6 and the heat dissipation space 7.

Furthermore, when the present invention is actually applied, the power will be supplied to the host hardware 231 on the casing 2 through the preset power cord (not shown), and the host hardware 231 will supply power to the hardware in the chassis of the present invention through the preset flat power cable (not shown). The display device 4 is connected to the chassis of the present invention after being energized through the flat power cable to display images on the display surface 42. After the display device 4 is operated, the heat source portion 43 inside the display device 4 will generate heat energy accumulation due to operation. At this time, the first fan set 111 on the base 1 and the second fan set 311 on the top cover 3 will transport wind power to the internal flow space 6, thereby driving the circulation of the internal heat source of the flow space 6, and the third fan set 5111 located on the air guide plate 5 will extract the heat source circulating in the flow space 6 to the heat dissipation space 7 on the other side, and the heat source extracted into the heat dissipation space 7 will be discharged out of the heat dissipation space 7 through the heat dissipation holes 220 on the heat dissipation side panel 22. Thus, it solves the problem of insufficient internal heat dissipation due to the installation of the display device 4 in the chassis of the present invention.

Figure 6:
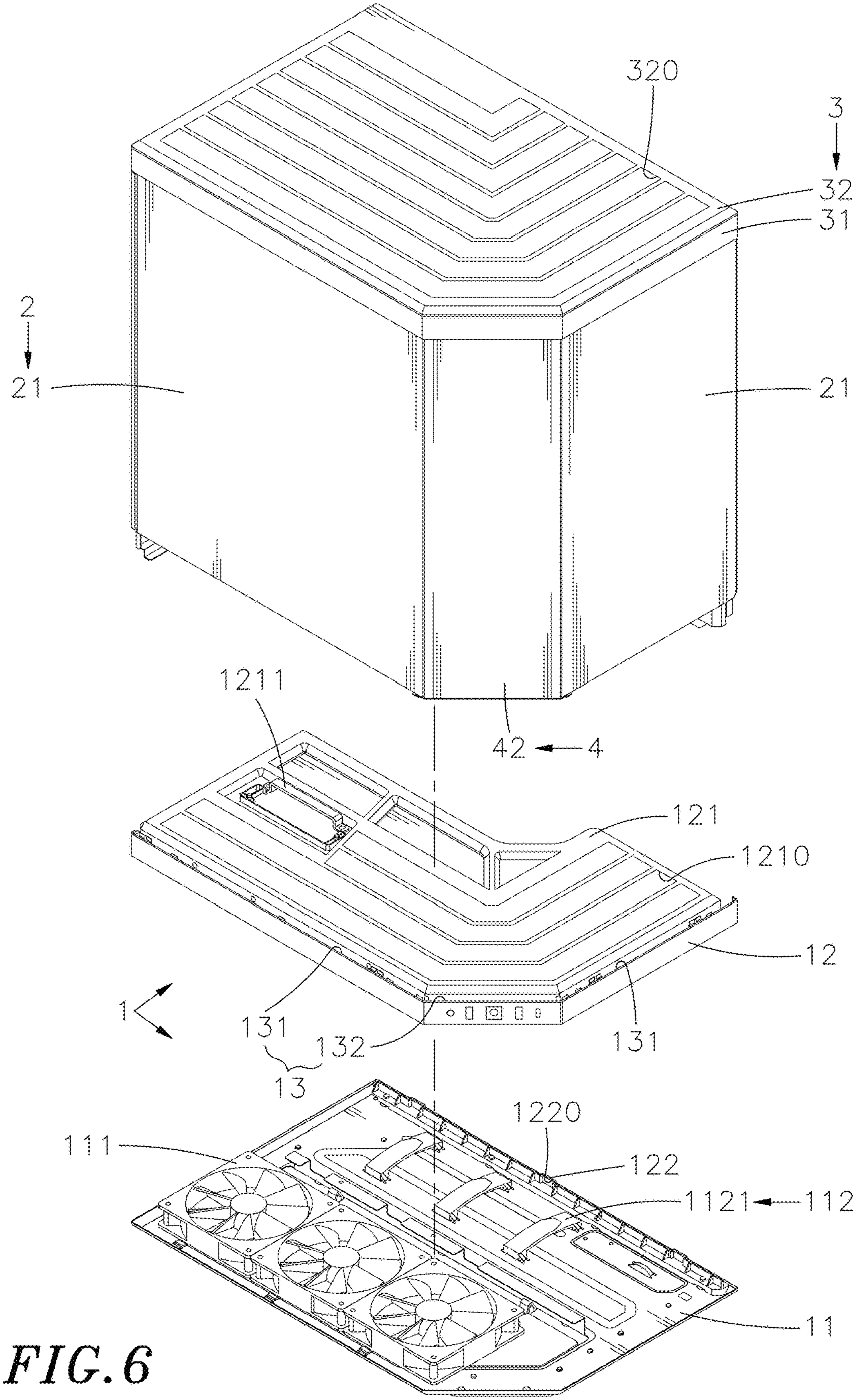
FIG. 6 is a schematic diagram of the assembly of the base of the display device-equipped chassis structure of the present invention.
Figure 7:
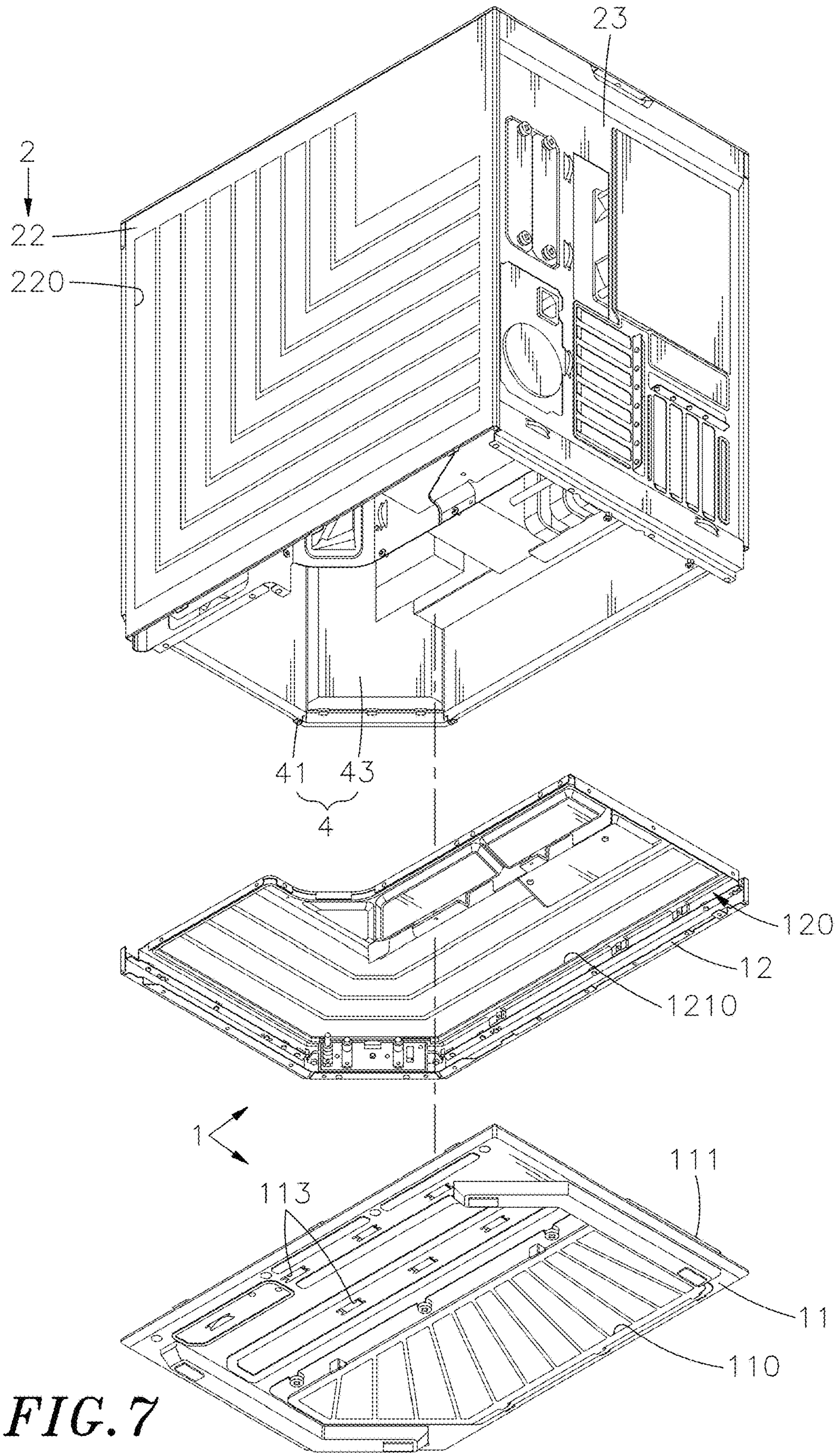
FIG. 7 is a schematic diagram of the assembly of the base of the display device-equipped chassis structure of the present invention when viewed from another angle.
Figure 8:
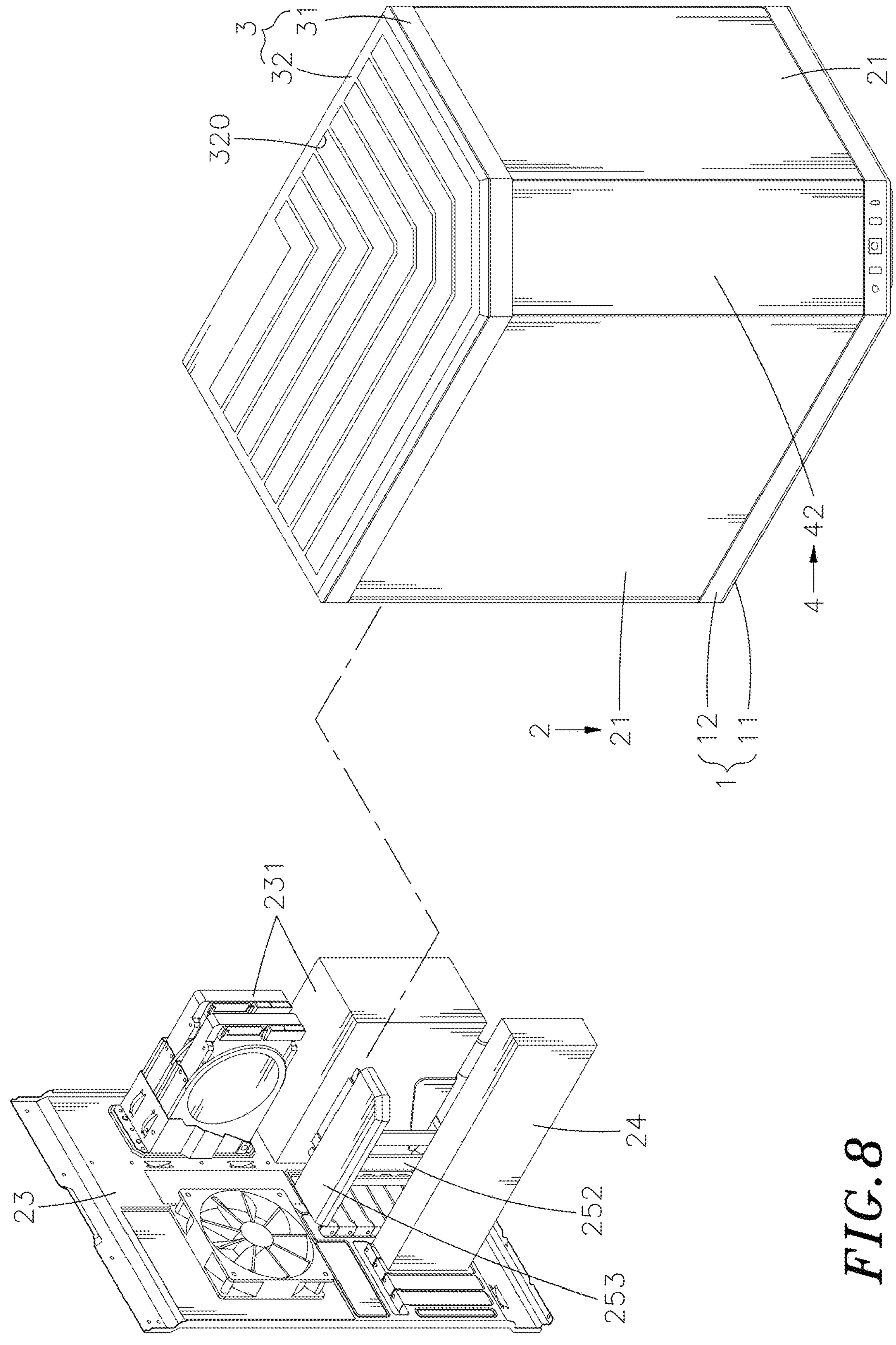
FIG. 8 is a schematic diagram of the assembly of the back panel of the display device-equipped chassis structure of the present invention.
Figure 9:
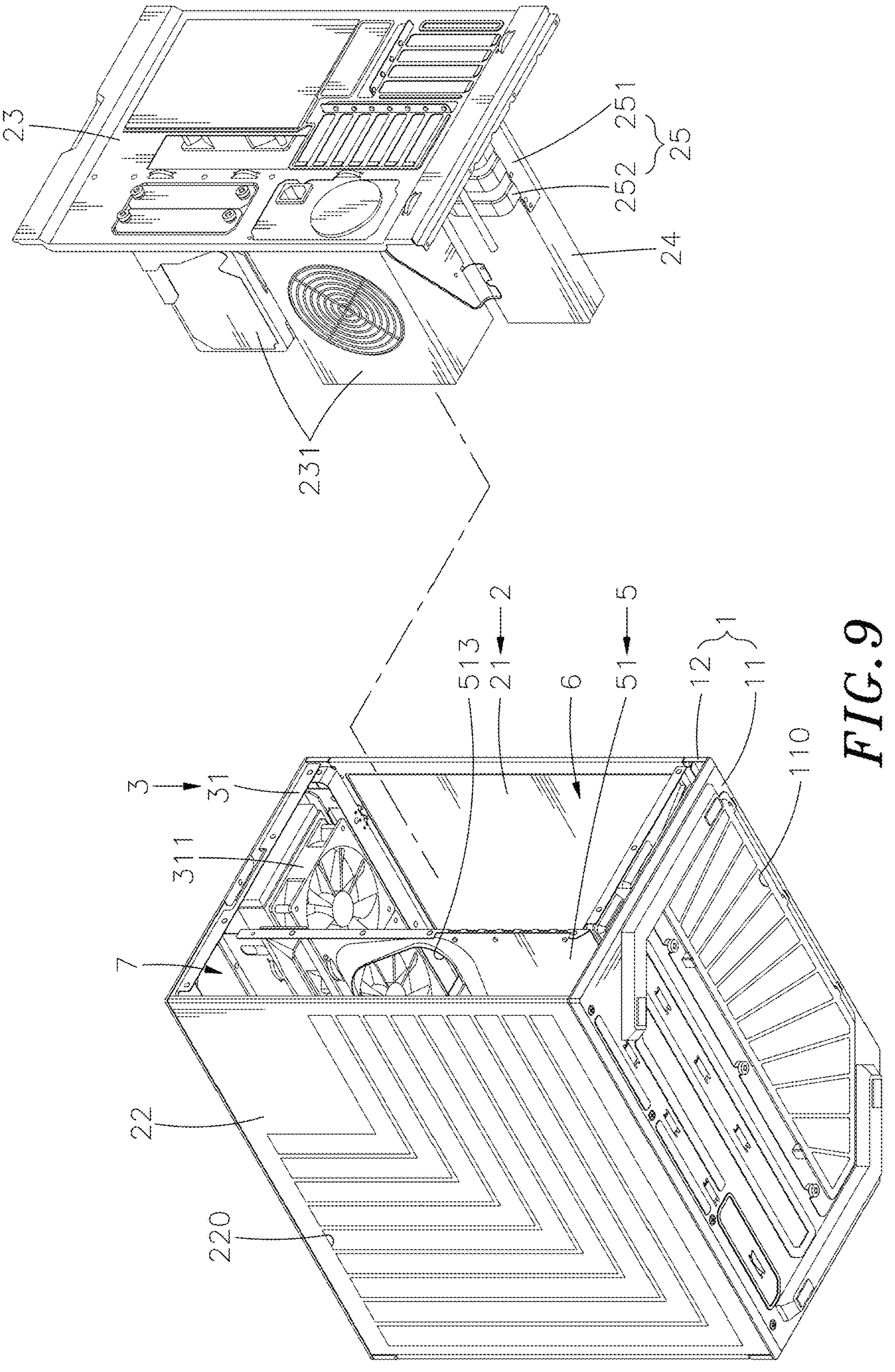
FIG. 9 is a schematic diagram of the assembly of the back panel of the display device-equipped chassis structure of the present invention when viewed from another angle.
Figure 10:
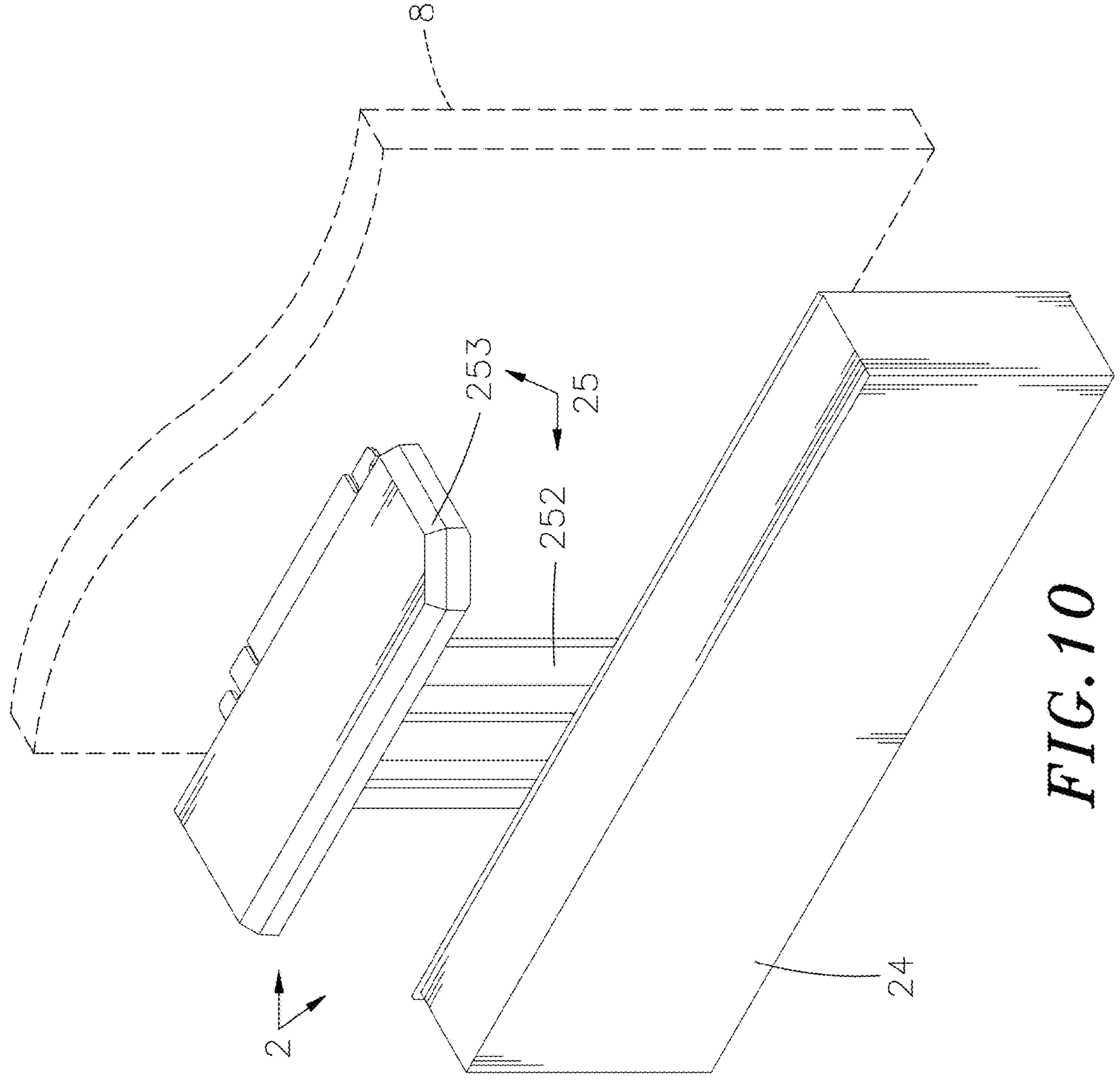
FIG. 10 is a three-dimensional appearance view of the electrical steering device of the display device-equipped chassis structure of the present invention.
Figure 11:
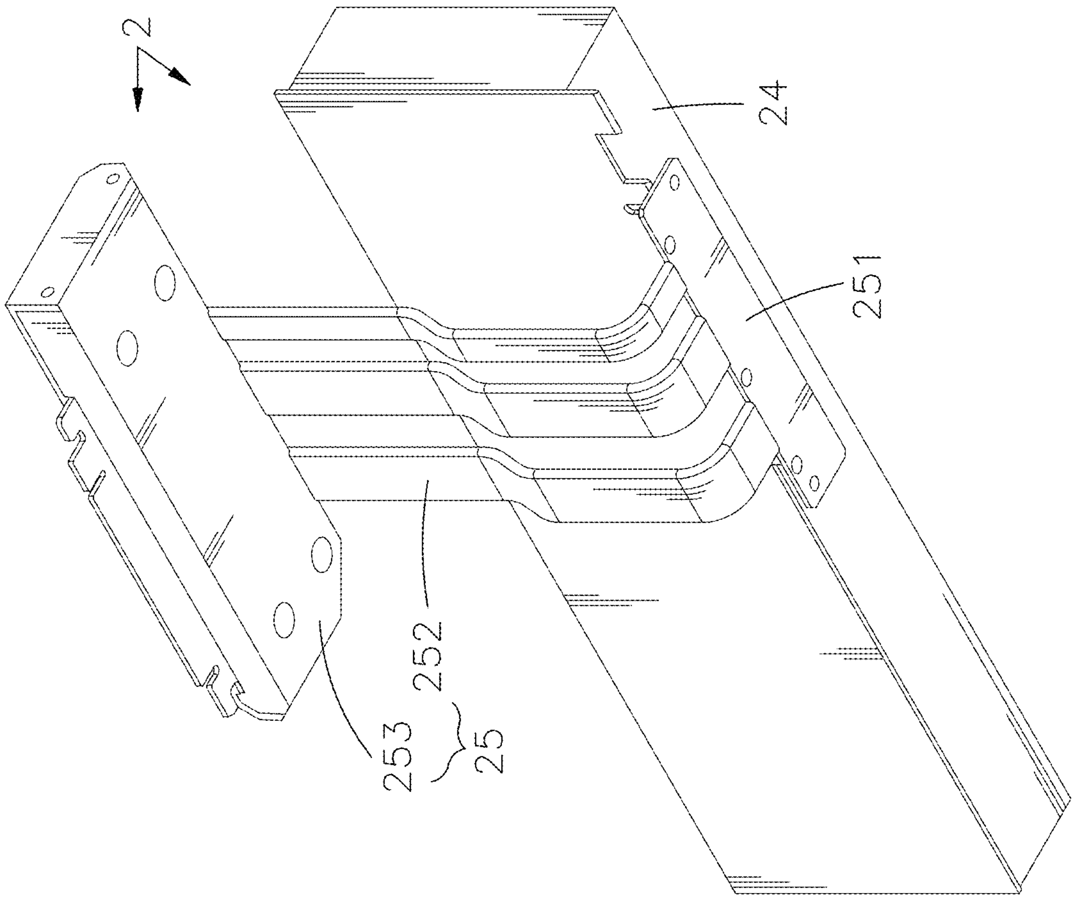
FIG. 11 is a three-dimensional appearance view of the electrical steering device of the display device-equipped chassis structure of the present invention when viewed from another angle.
Figure 12:
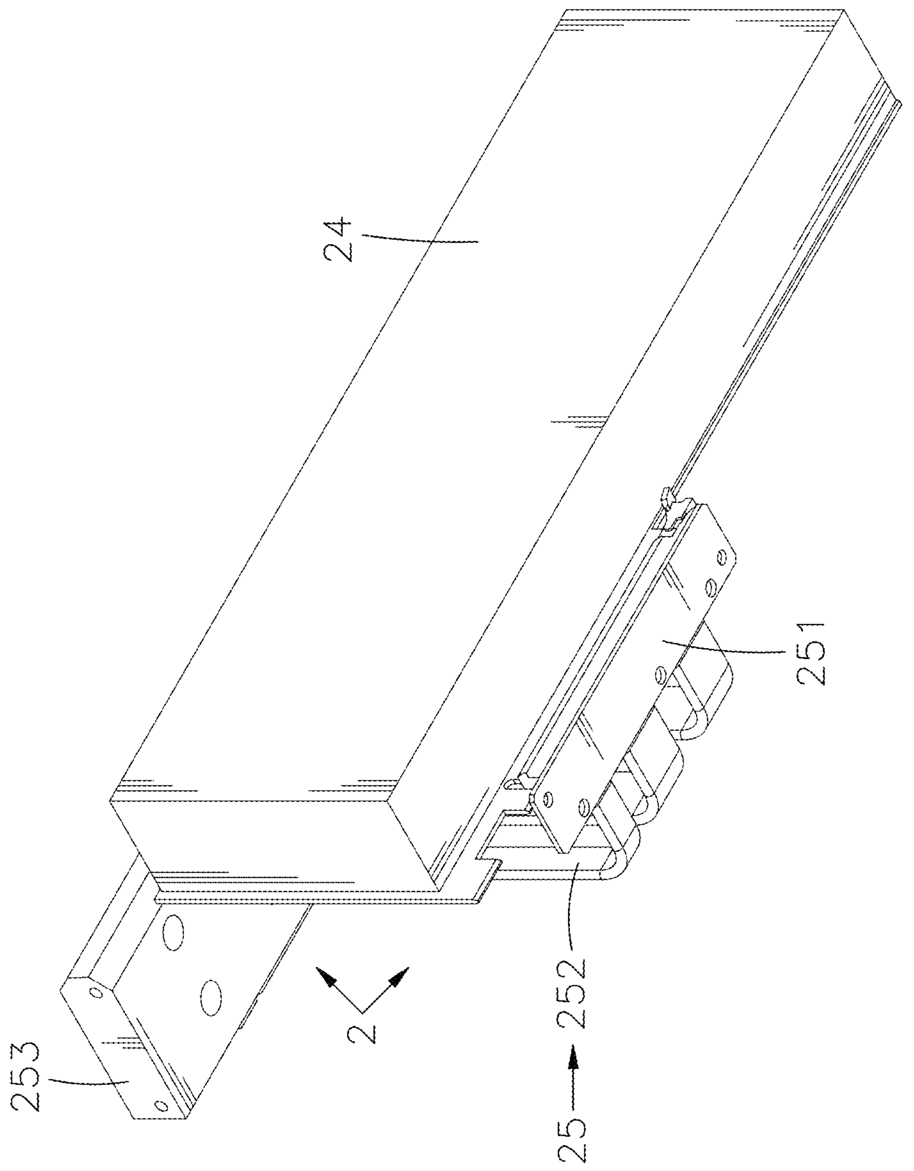
FIG. 12 is a three-dimensional bottom view of the electrical steering device of the display device-equipped chassis structure of the present invention.

Furthermore, the surface of the first assembly frame 12 has a handle 1211 extending upward for people to hold (as shown in FIG. 6), which facilitates the quick disassembly of the first fan set 111 for internal inspection and maintenance.

In addition, the wire organizer 112 provided on the bottom panel 11 is not covered or shielded by the first assembly frame 12, and the flat cable straps 1121 of the wire organizer 112 can be used to organize the interconnected plurality of flat cables in the host hardware 231 (not shown). The flat cable straps 1121 form a tight fastening state for the flat cables passing through the pairs of cable holes 113 on the bottom panel 11, making the flat cables neat and beautiful, and also preventing the flat cables from blocking the flow of wind in the flow space 6.

Moreover, the surfaces of the above-mentioned flat cable straps 1121 can be formed into a tightened and fastened state repeatedly or once by using hook and loop fastener, gluing or sewing. Such simple equal changes and modifications do not limit the scope of protection of the present invention, and are hereby stated.

Furthermore, please refer to FIGS. 8 to 12, which are schematic diagram of the assembly of the back panel of the display device-equipped chassis structure of the present invention, schematic diagram of the assembly of the back panel of the display device-equipped chassis structure of the present invention when viewed from another angle, three-dimensional appearance view of the electrical steering device of the display device-equipped chassis structure of the present invention, three-dimensional appearance view of the electrical steering device of the display device-equipped chassis structure of the present invention when viewed from another angle and three-dimensional bottom view of the electrical steering device of the display device-equipped chassis structure of the present invention. It can be clearly seen from the drawings that the back panel 23 of the present invention is assembled with a motherboard 8 vertically arranged in the flow space 6, and an electrical steering device 25 is assembled on one side of the back panel 23 adjacent to the motherboard 8. The electrical steering device 25 comprises an electrical socket connector 251 for vertical insertion of a display card 24, and an adapter card 253 provided on one side of the electrical socket connector 251 and horizontally turned then inserted into the motherboard 8 through a plurality of connecting flat cables 252 to form an electrical connection. Through the above-mentioned electrical steering device 25, the display card 24, which was originally inserted horizontally into the motherboard 8, remains in a vertical state to form an electrical connection with the motherboard 8. This prevents the display card 24 from being tilted downward due to the influence of gravity when the display card 24 is directly inserted into the motherboard 8 in a horizontal state, and avoiding poor contact or even separation between the display card 24 and the motherboard 8.

Figure 13:
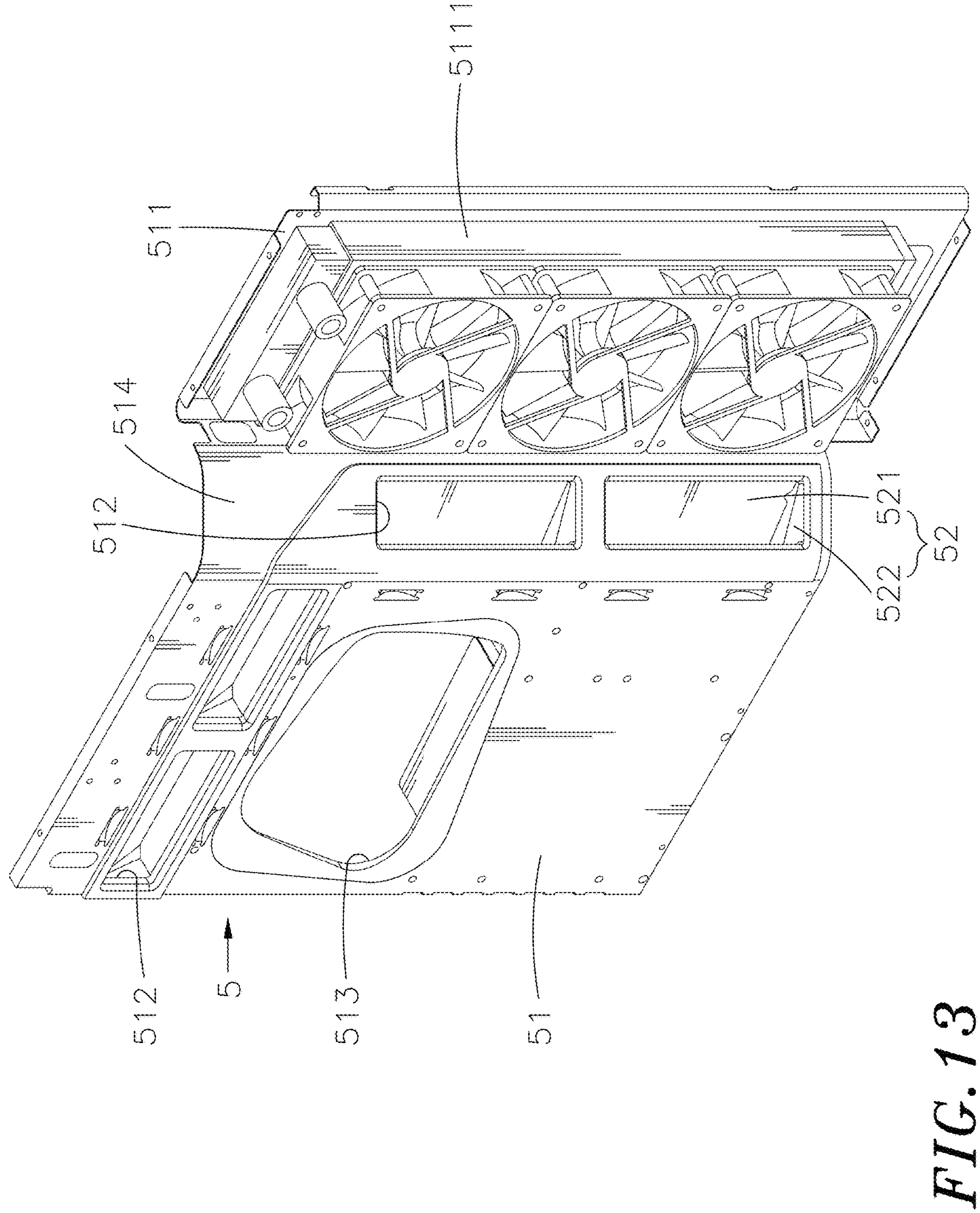
FIG. 13 is a three-dimensional appearance view of the air guide plate of the display device-equipped chassis structure of the present invention.
Figure 14:
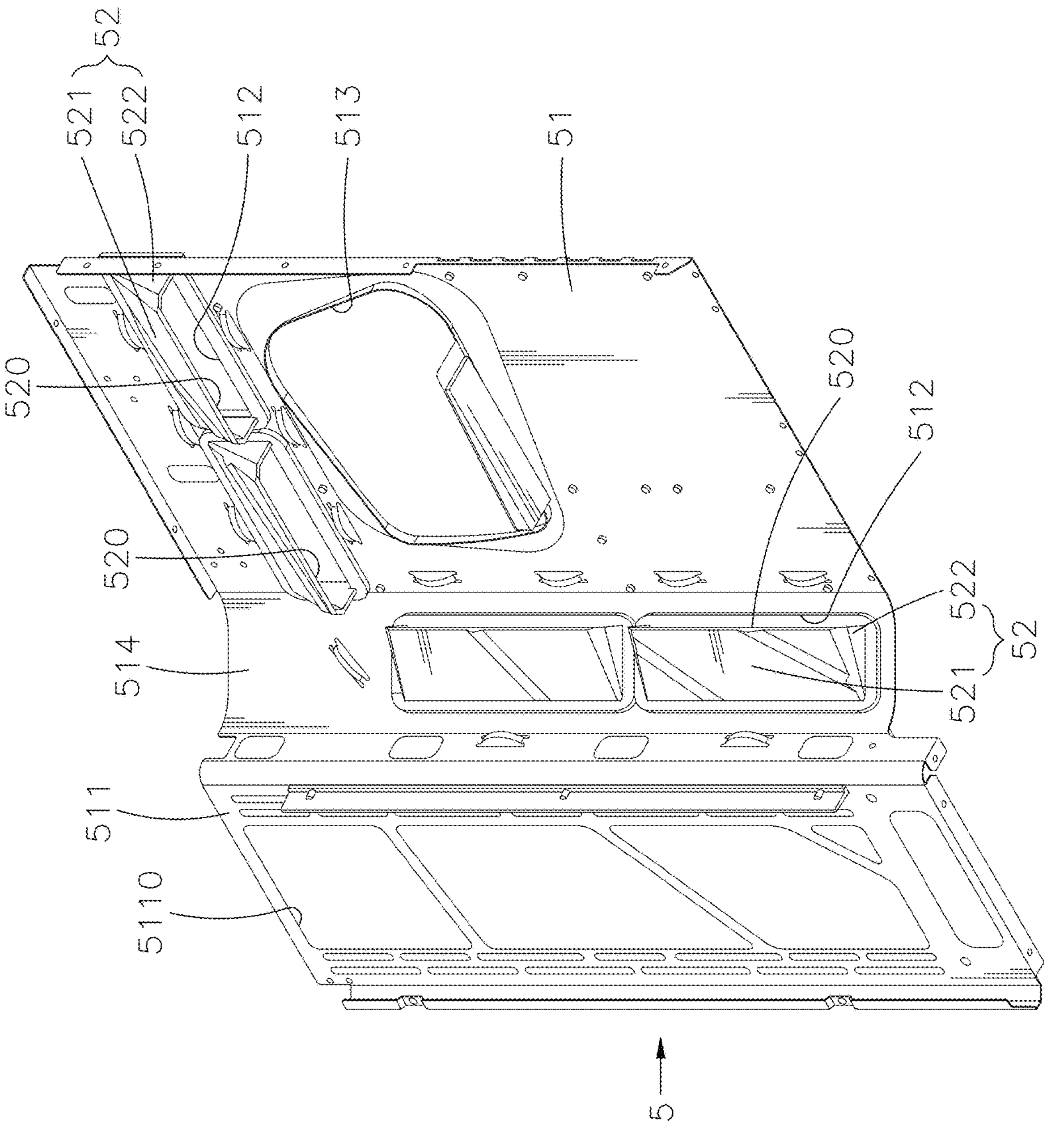
FIG. 14 is a three-dimensional appearance view of the air guide plate of the display device-equipped chassis structure of the present invention when viewed from another angle.

Furthermore, please refer to FIGS. 13 and 14, which are three-dimensional appearance view of the air guide plate of the display device-equipped chassis structure of the present invention and three-dimensional appearance view of the air guide plate of the display device-equipped chassis structure of the present invention when viewed from another angle. It can be clearly seen from the drawings that the host hardware 231 on the back panel 23 of the casing 2 of the present invention are respectively located on both sides of the flow space 6 and the heat dissipation space 7 due to the assembly of the air guide plate 5. In order to connect the host hardware 231, the air guide plate 5 is provided with flat cable holes 512 for a plurality of flat cables (not shown) to pass through to connect each host hardware 231, and one side of each flat cable hole 512 facing the heat dissipation space 7 is provided with a downwardly inclined wind shield 52. The surface of the wind shield 52 has an inclined surface 521 gradually extending toward one side, and two adjacent sides of the inclined surface 521 are respectively provided with side walls 522 connected to the flat cable holes 512 to form a barrier. A connection port 520 is formed between the inclined surface 521 and each side wall 522 for the flat cables to pass through. The gradient surface of the inclined surface 521 of the wind shield 52 can be used to guide the heat source to deviate from the position of the connection port 520, thereby preventing the heat source pumped into the heat dissipation space 7 from flowing back into the flow space 6.

Figure 15:
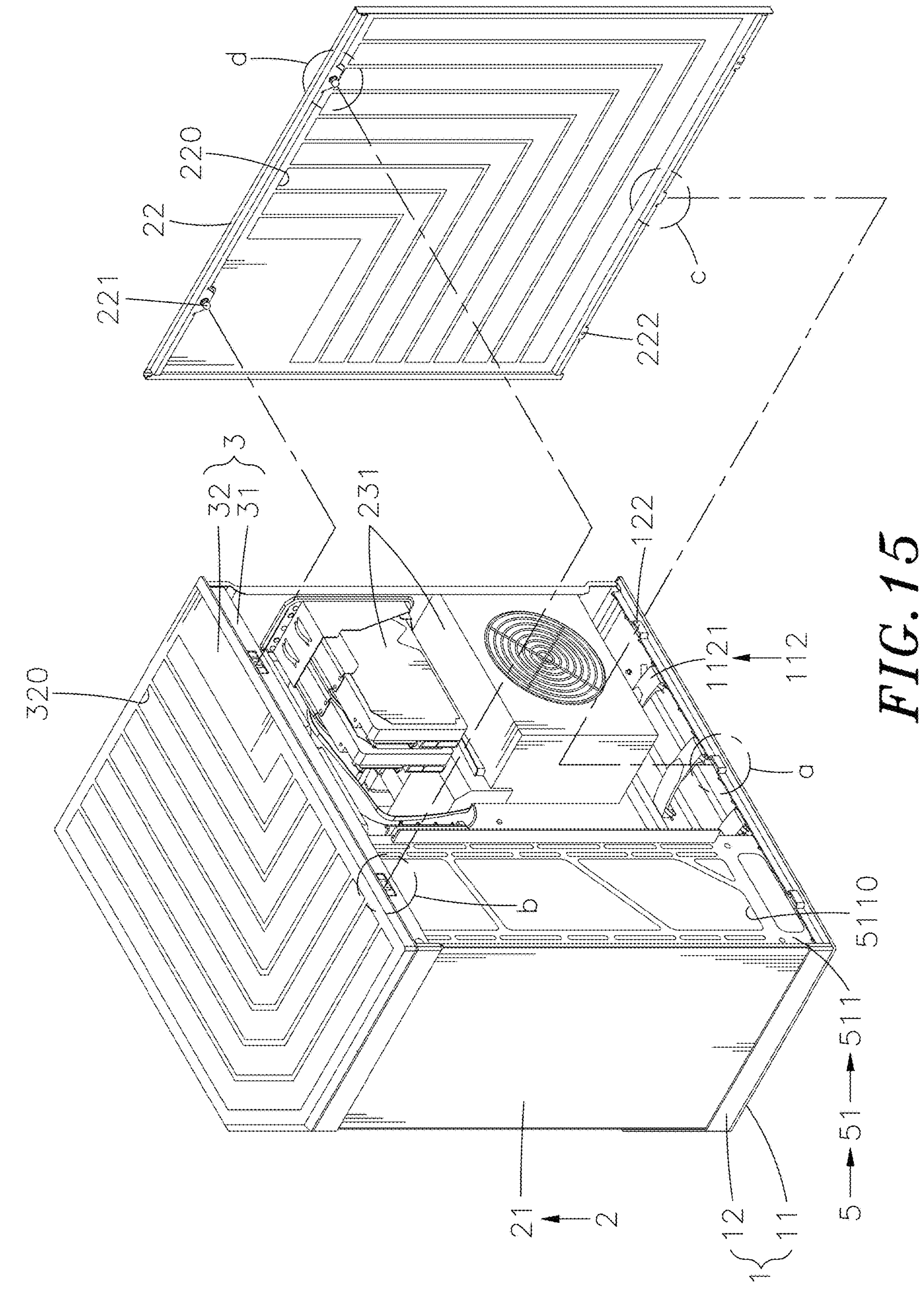
FIG. 15 is a schematic diagram of the assembly of the casing of the display device-equipped chassis structure of the present invention.
Figure 16:
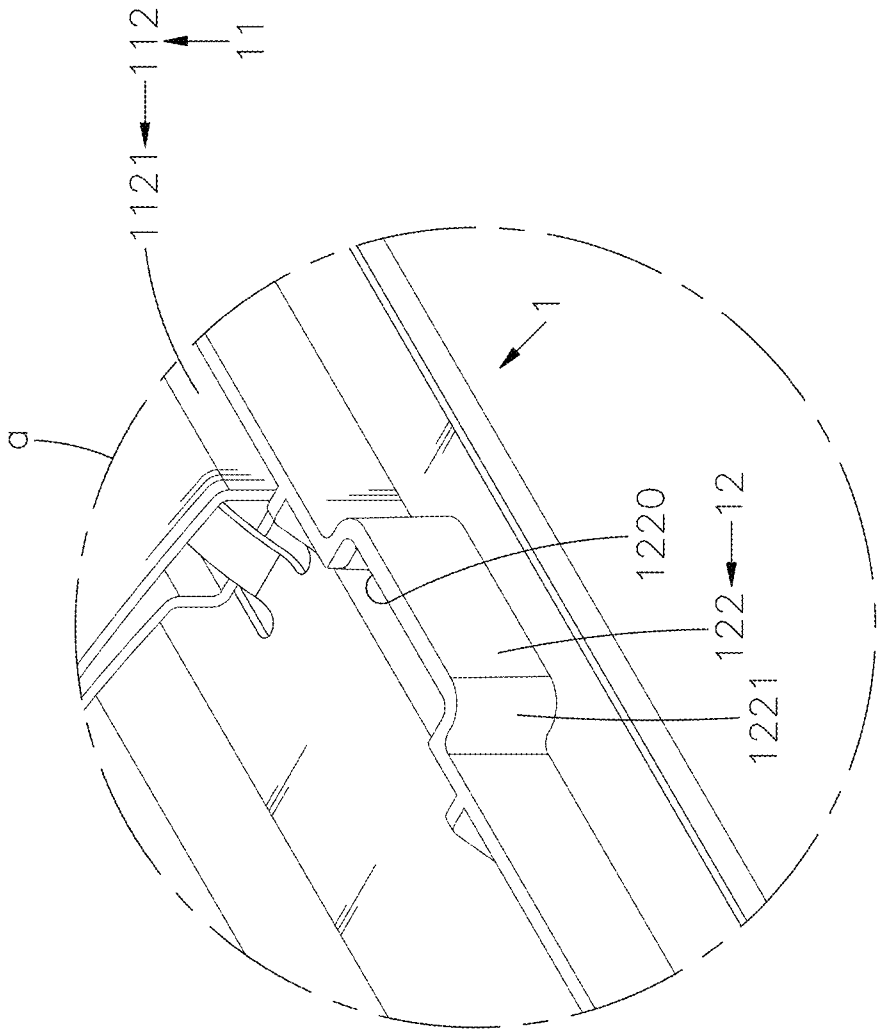
FIG. 16 is an enlarged view of part a of FIG. 15.
Figure 17:
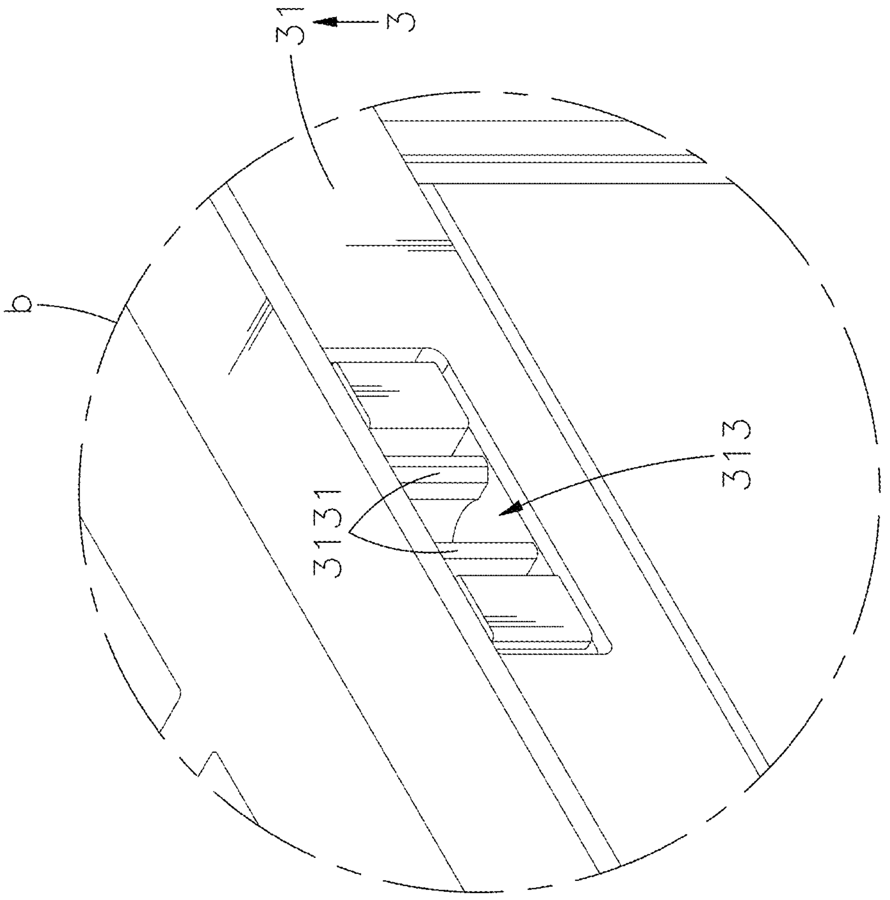
FIG. 17 is an enlarged view of part b of FIG. 15.
Figure 18:
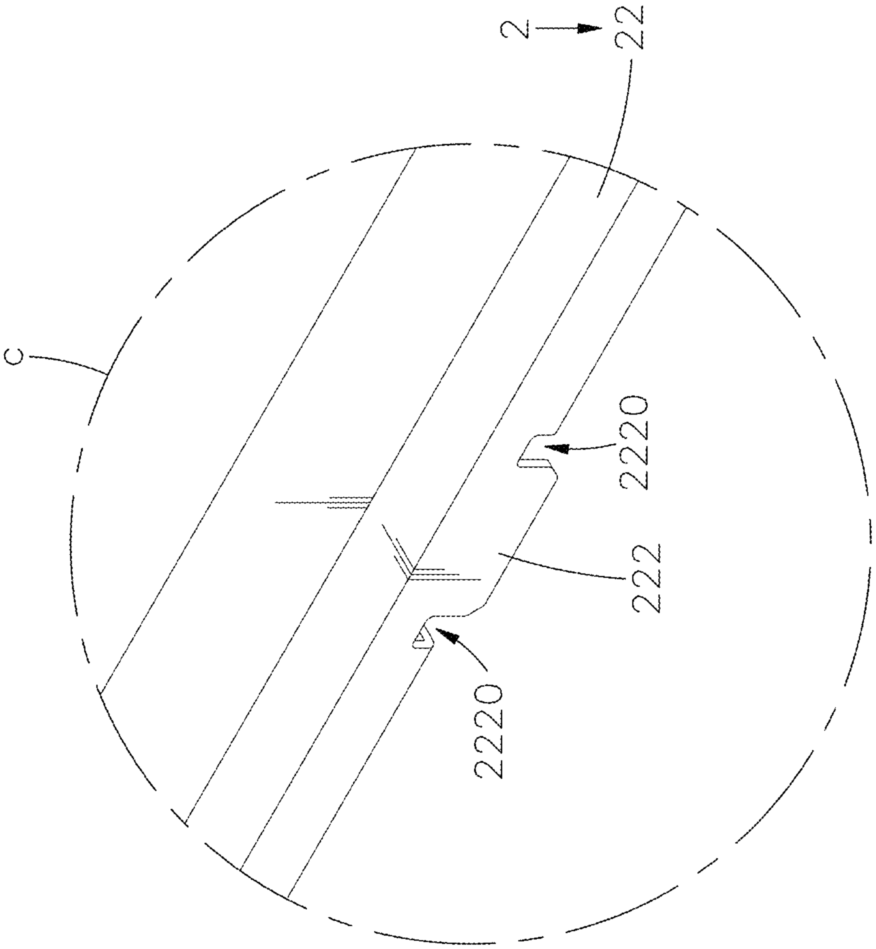
FIG. 18 is an enlarged view of part c of FIG. 15.
Figure 19:
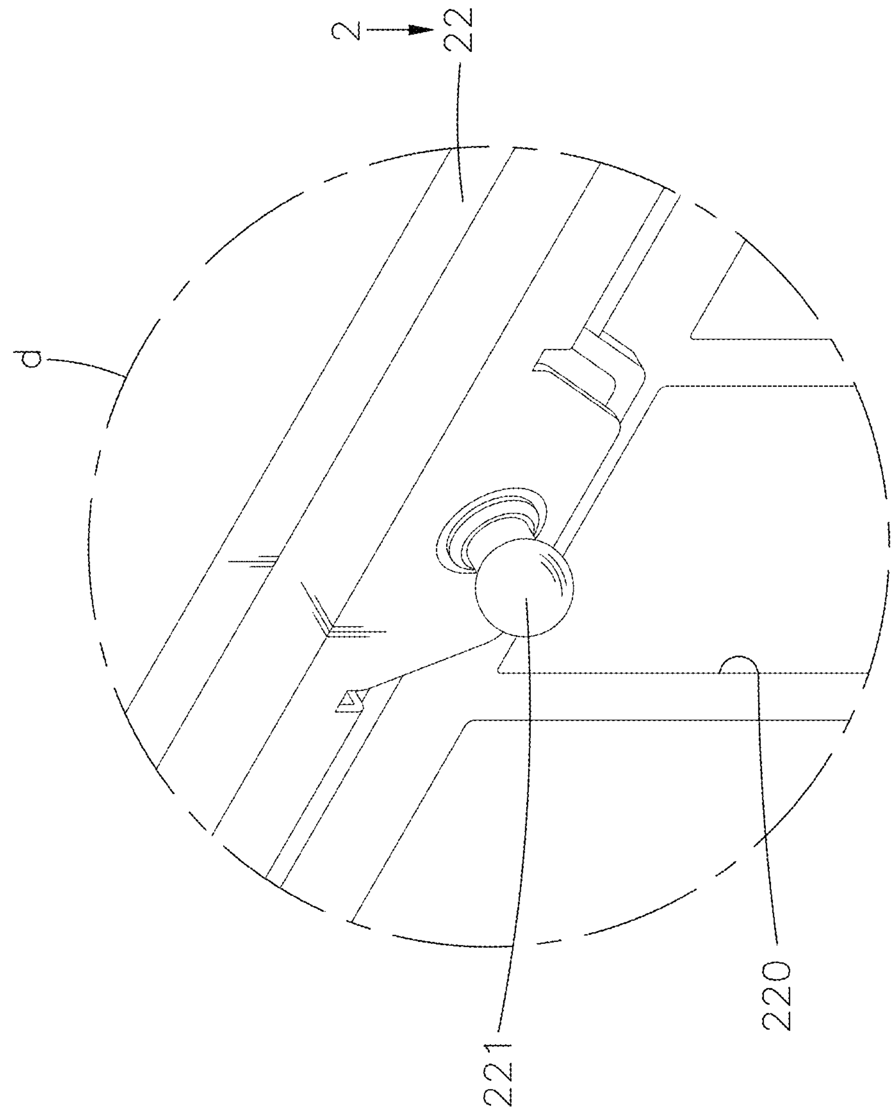
FIG. 19 is an enlarged view of part d of FIG. 15.

In addition, please refer to FIGS. 15 to 19, which are schematic diagram of the assembly of the casing of the display device-equipped chassis structure of the present invention, enlarged view of part a of FIG. 15, enlarged view of part b of FIG. 15, enlarged view of part c of FIG. 15 and enlarged view of part d of FIG. 15. It can be clearly seen from the drawings that the second assembly frame 31 of the top cover 3 is provided with at least one positioning groove 313 in the direction toward the heat dissipation side panel 22, and the positioning groove 313 has two relatively inwardly inclined positioning plates 3131. The heat dissipation side panel 22 corresponding to the positioning grooves 313 is provided with elastic second positioning bumps 221 that are spherical, slightly larger than the positioning grooves 313. A plurality of flange portions 122 are provided on one side of the first assembly frame 12 facing the heat dissipation side panel 22, and each of the flange portions 122 is provided with a slot 1220 inward, and two positioning walls 1221 are respectively extending inward from two sides of each flange portion 122. The heat dissipation side panel 22 corresponding to each slot 1220 is provided with a fitting block 222 convexly, and two fitting grooves 2220 are respectively provided on both sides of each fitting block 222. The fitting blocks 222 at the bottom of the heat dissipation side panel 22 are respectively embedded in the slots 1220 of the flange portions 122 of the base 1. At the same time, the fitting grooves 2220 on both sides of each fitting block 222 will be respectively embedded in the positioning walls 1221 on both sides of each flange portion 122 to form positioning. Then the second positioning bumps 221 on the top of the heat dissipation side panel 22 are buckled into the corresponding positioning grooves 313 of the top cover 3, and the elastic and slightly larger second positioning bumps 221 will be elastically deformed by the pressure of the positioning plates 3131 on the positioning grooves 313, after buckling into the positioning grooves 313, the second positioning bumps 221 will be elastically reset to be buckled and fixed the heat dissipation side panel 22. Thus the heat dissipation side panel 22 can be disassembled and assembled by snapping, so as to facilitate quick disassembly and assembly of the chassis of the present invention during maintenance and inspection.

Figure 20:
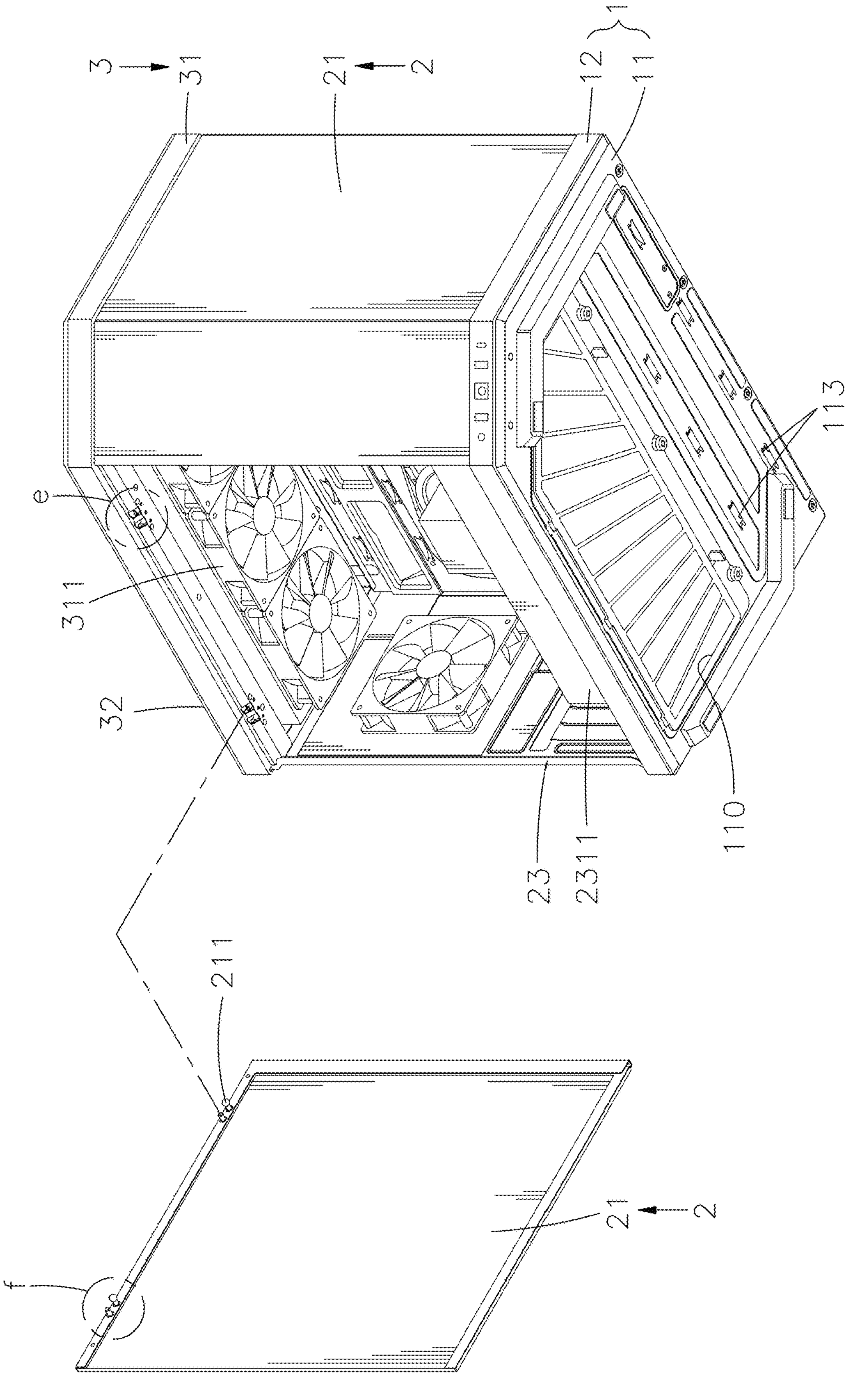
FIG. 20 is a schematic diagram of the assembly of the side panels of the display device-equipped chassis structure of the present invention.
Figure 21:
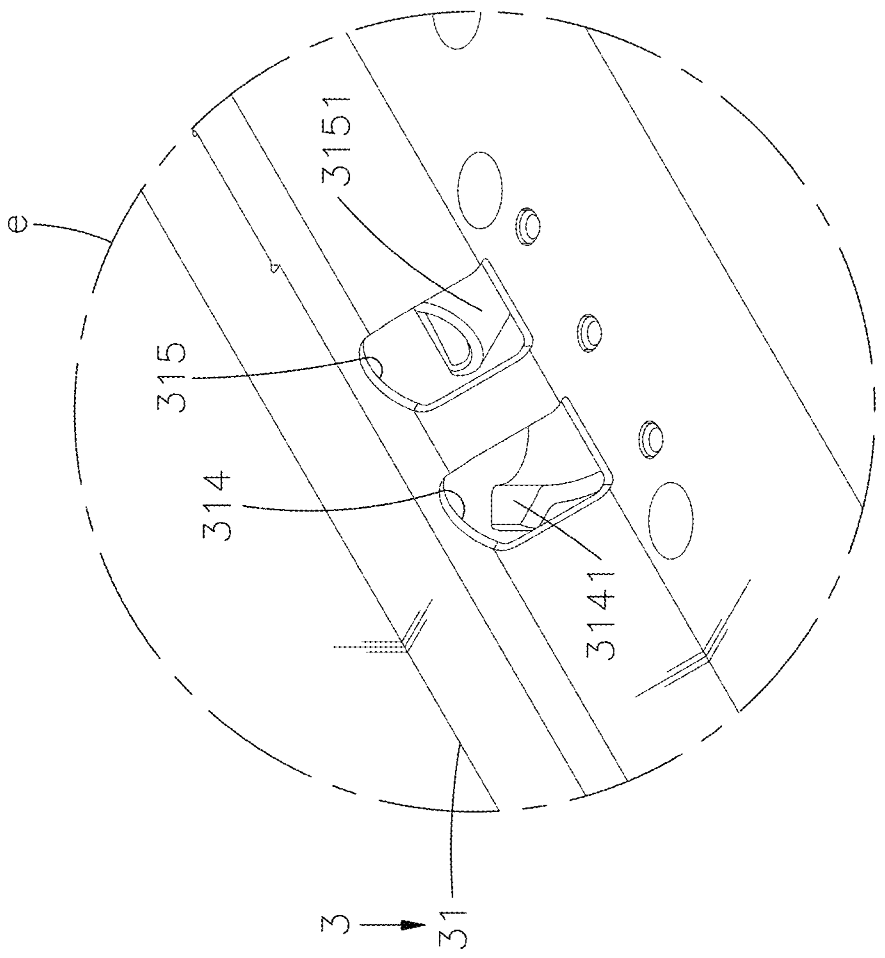
FIG. 21 is an enlarged view of part e of FIG. 20.
Figure 22:
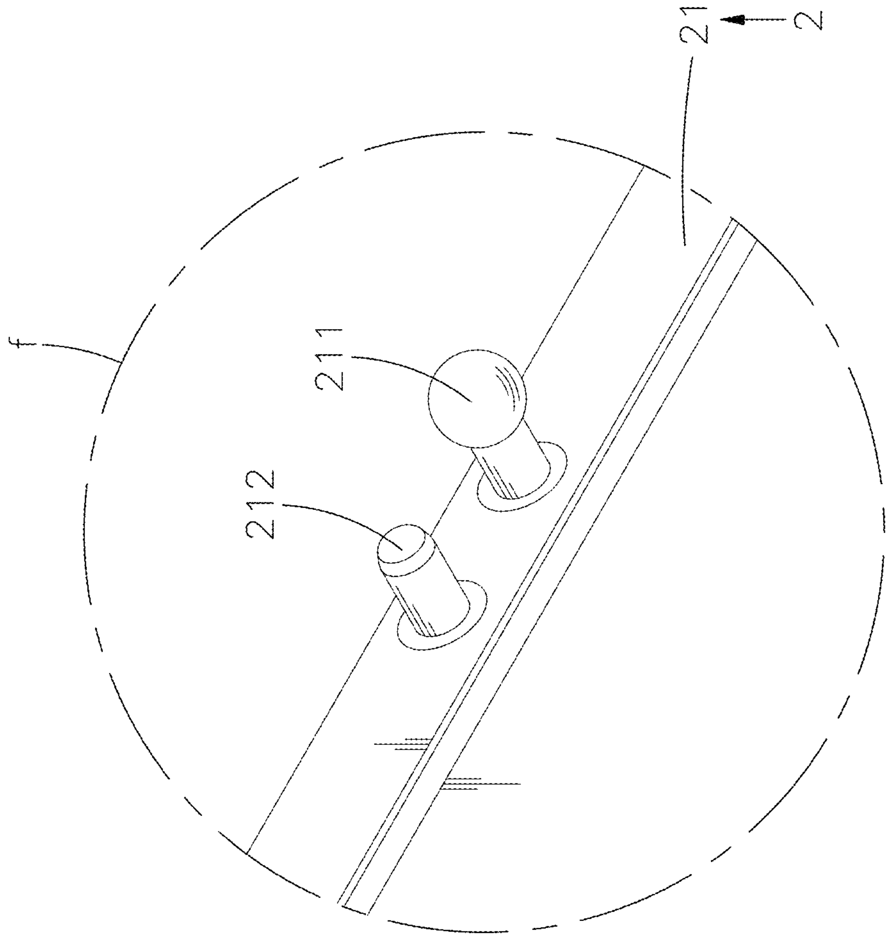
FIG. 22 is an enlarged view of part f of FIG. 20.

Furthermore, please refer to FIGS. 20 to 22, which are schematic diagram of the assembly of the side panels of the display device-equipped chassis structure of the present invention, enlarged view of part e of FIG. 20 and enlarged view of part f of FIG. 20. It can be clearly seen from the drawings that the second assembly frame 31 of the top cover 3 is provided with a plurality of first side panel fixing grooves 314 and a plurality of second side panel fixing grooves 315 toward each side panel 21. Each of the first side panel fixing grooves 314 is provided with an elastic and inward arc-shaped fixing sleeve 3141 inside, and each of the second side panel fixing grooves 315 is provided with an elastic and inclined support rod 3151 inside. Each side panel 21 is provided with a spherical and elastic first positioning bump 211 corresponding to the respective first side panel fixing groove 314, and a protrusion 212 corresponding to the respective second side panel fixing groove 315. When assembling the side panels 21, the bottom of each side panel 21 is firstly installed in the corresponding first positioning groove 131 of the base 1, and then the first positioning bumps 211 on each side panel 21 are buckled into the corresponding first side panel fixing groove 314 of the top cover 3, so that the elastic first positioning bumps 211 are compressed and elastically deformed by the fixing sleeves 3141 in the first side panel fixing grooves 314 and inserted into the arc-shaped concave inner walls of the respective fixing sleeves 3141 to form a fixation. At the same time, the protrusions 212 will respectively extend into the second side panel fixing grooves 315, and the inclined support rods 3151 in the second side panel fixing grooves 315 will resist the bottom surfaces of the protrusions 212 to form a fixation. Thus the side panels 21 can be disassembled and assembled by snapping, so as to facilitate quick disassembly and assembly of the chassis of the present invention during maintenance and inspection.

The main feature of the present invention is that the chassis equipped with the display device 4 causes the internal temperature to increase, so the air guide plate 5 is assembled to distinguish the flow space 6 and heat dissipation space 7 and cooperate with the first fan set 111, the second fan set 311 and the third fan set 5111 for efficient heat dissipation. The minor object of the present invention is that the two side panels 21 on the casing 2 of the chassis and the heat dissipation side panel 22 can be easily disassembled and assembled by snapping, so as to facilitate quick disassembly and assembly of the device of the present invention during maintenance and inspection.

The above are only preferred embodiments of the present invention, and do not limit the patent scope of the present invention. Therefore, all simple modifications and equivalent structural changes made by using the contents of the description and drawings of the present invention shall be included in the patent scope of the present invention and shall be clearly stated.

In summary, the above-mentioned display device-equipped chassis structure of the present invention can indeed achieve its effect and purpose when used in actual applications. Therefore, this invention is truly an invention with excellent practicality. In order to meet the application requirements for a new patent, the application must be filed in accordance with the law. We hope that the review committee will approve this case as soon as possible to protect the inventor's hard work on research and development. If the review committee has any doubts, please feel free to send us a letter for instructions. The inventor will do our best to cooperate, which will be greatly appreciated.

What the invention claimed is:

1. A display device-equipped chassis structure, comprising a base, a casing, a top cover, a display device and an air guide plate, wherein:

said base comprises a bottom panel, a first assembly frame, a first fan set provided on said bottom panel, a plurality of bottom panel heat dissipation vents located at a bottom side of said bottom panel corresponding to said first fan set, a wire organizer with a plurality of flat cable straps provided on one side of said bottom panel adjacent to said first fan set, a storage chamber located at a bottom side of said first assembly frame to cover said first fan set, a storage surface located on a top of said first assembly frame and provided with a plurality of air guide holes, a handle extending upward from a surface of said first assembly frame for people to hold, and a positioning structure provided on an outer periphery of said first assembly frame adjacent to said first fan set, said positioning structure comprising at least two first positioning grooves for the assembly of said casing and a second positioning groove located between at least two of said first positioning grooves for said display device to be assembled;

said casing comprises at least two side panels respectively positioned on said first positioning grooves, a heat dissipation side panel with a plurality of heat dissipation holes assembled on one side of said side panels away from said second positioning groove, and a back panel set between said heat dissipation side panel and one of said side panels;

said top cover is assembled on a top side of said casing, said top cover comprising a second assembly frame, a top cover heat sink assembled on said second assembly frame and a second fan set assembled on one side of a bottom surface of said second assembly frame adjacent to said display device, said second assembly frame comprising a plurality of ventilation openings corresponding to said second fan set, a fixing portion located on one side of said second assembly frame corresponding to said display device and a plurality of fixing grooves provided in said fixing portion, said top cover heat sink comprising a plurality of top cover heat dissipation vents on its surface;

said display device comprises a plurality of mounting portions assembled at said second positioning groove of said base, a display surface with a display screen provided on a surface of said display device, and a heat source portion provided on one side thereof inside said casing, each of said mounting portions comprising at least a mounting hole for penetration and fixation of a respective preset screw;

said air guide plate comprises a main body set on said base between said display device and said heat dissipation side panel, a flow space formed between said main body and said display device, a heat dissipation space formed between said main body and said heat dissipation side panel, an exhaust portion located on one side of said main body and a third fan set mounted in said exhaust portion.

2. The display device-equipped chassis structure as claimed in claim 1, wherein said bottom panel of said base comprises pairs of cable holes for said flat cable straps to be inserted and fixed.

3. The display device-equipped chassis structure as claimed in claim 1, wherein-the surfaces of said flat cable straps are formed into a tightened and fastened state by selectively using hook and loop fasteners, gluing, or sewing.

4. The display device-equipped chassis structure as claimed in claim 1, wherein said air guide plate further comprises a plurality of exhaust openings located on said exhaust portion of one side of said main body corresponding to said third fan set, a plurality of flat cable holes and a window located on said main body, and a downwardly inclined wind shield provided on each said flat cable hole.

5. The display device-equipped chassis structure as claimed in claim 4, wherein a surface of each said wind shield comprises an inclined surface extending gradually toward one side, two side walls respectively located at two opposite sides of said inclined surface and connected to said flat cable hole to form a barrier, and a connection port formed between said inclined surface and each of said side walls.

6. The display device-equipped chassis structure as claimed in claim 1, further comprising a motherboard mounted on said back panel and vertically arranged in said flow space and an electrical steering device assembled on one side of said back panel adjacent to said motherboard, said electrical steering device comprising an electrical socket connector for vertical insertion of a display card, an adapter card provided on one side of said electrical socket connector and horizontally turned then inserted into said motherboard, and a plurality of connecting flat cables to form an electrical connection between the display card, and the adapter card.

7. The display device-equipped chassis structure as claimed in claim 1, wherein said top cover further comprises at least a third positioning groove in a direction toward said heat dissipation side panel, and said third positioning groove has two relatively inwardly inclined positioning plates set therein; said heat dissipation side panel corresponding to said third positioning grooves comprises a plurality of elastic second positioning bumps, which are slightly larger than said third positioning grooves and inserted into said third positioning grooves; one side of said base further comprises a plurality of flange portions facing said heat dissipation side panel, a slot formed in each of said flange portions and two positioning walls respectively extending inward from two sides of each of said flange portions; said heat dissipation side panel comprises a plurality of fitting blocks respectively fitted into said slots, and two fitting grooves respectively provided on both sides of each said fitting block and embedded in a respective one of said positioning walls.

8. The display device-equipped chassis structure as claimed in claim 7, wherein said second positioning bumps are in each spherical shaped.

9. The display device-equipped chassis structure as claimed in claim 1, wherein said top cover further comprises a plurality of first side panel fixing grooves in a direction toward each of said side panels, and an elastic and inward arc-shaped fixing sleeve located in each of said first side panel fixing grooves; each of said side panels comprises a plurality of elastic first positioning bumps corresponding to said first side panel fixing grooves and respectively embedded in the respective said fixing sleeve to form a fixation.

10. The display device-equipped chassis structure as claimed in claim 9, wherein said first positioning bumps are each spherical shaped.

11. The display device-equipped chassis structure as claimed in claim 1, wherein said top cover further comprises a plurality of second side panel fixing grooves in a direction toward each of said side panels and an elastic and inclined support rod located in each of said second side panel fixing grooves; each of said side panels corresponding to said second side panel fixing grooves comprises a plurality of protrusions respectively inserted into each of said second side panel fixing grooves to stop against said inclined support rod.

12. The display device-equipped chassis structure as claimed in claim 1, wherein said main body comprises a curved bending portion on one side thereof.

* * * * *